United States Patent
Konno

(10) Patent No.: US 7,060,537 B2
(45) Date of Patent: Jun. 13, 2006

(54) MICROCHIP CONTROLLER BOARD MANUFACTURING METHOD

(75) Inventor: Mitsuo Konno, Miyota-machi (JP)

(73) Assignee: Minebea Co., Ltd., Kitasaku-gun (JP)

( * ) Notice: Subject to any disclaimer, the term of this patent is extended or adjusted under 35 U.S.C. 154(b) by 0 days.

(21) Appl. No.: 11/007,244

(22) Filed: Dec. 9, 2004

(65) Prior Publication Data

US 2005/0101058 A1    May 12, 2005

Related U.S. Application Data

(62) Division of application No. 09/911,534, filed on Jul. 25, 2001, now Pat. No. 6,917,120.

(30) Foreign Application Priority Data

Aug. 3, 2000    (JP) .............................. 2000-235685

(51) Int. Cl.
*H01L 21/48* (2006.01)
*H01L 23/48* (2006.01)
*H05K 3/00* (2006.01)

(52) U.S. Cl. ................ 438/125; 438/129; 438/612; 438/619; 29/829; 29/846; 29/854; 29/857; 257/692; 257/773; 257/775; 257/786

(58) Field of Classification Search ...................... None
See application file for complete search history.

(56) References Cited

U.S. PATENT DOCUMENTS

| 4,635,165 A | 1/1987 | Okuaki ........................ 361/684 |
| 5,479,694 A * | 1/1996 | Baldwin ........................ 29/593 |
| 6,285,081 B1 | 9/2001 | Jackson ........................ 257/738 |
| 6,646,349 B1 | 11/2003 | Pu et al. ........................ 257/758 |

FOREIGN PATENT DOCUMENTS

JP    01140650 A    6/1989

* cited by examiner

*Primary Examiner*—Alonzo Chambliss
(74) *Attorney, Agent, or Firm*—Oliff & Berridge, PLC

(57) ABSTRACT

A reliable microchip controller board and a manufacturing method thereof suitable for mass production are provided. A board wherein a programmable microchip controller is mounted includes; terminals for writing a program into the microchip controller and a circuit pattern connecting an operating terminal to shared terminals which are disconnected. A non-programmed microchip controller is mounted on the board in a state where patterns are disconnected and then programmed. The disconnected portion is connected thereafter.

2 Claims, 5 Drawing Sheets

MICROCHIP CONTROLLER BOARD MANUFACTURING METHOD

This is a Division of application Ser. No. 09/911,534 filed Jul. 25, 2001 now U.S. Pat. No. 6,917,120. The entire disclosure of the prior application is hereby incorporated by reference herein in its entirety.

BACKGROUND OF THE INVENTION

1. Field of the Invention

The present invention relates to a microchip controller board and a manufacturing method thereof.

2. Description of the Related Art

In a product using various boards on which microchip controllers are mounted, for example, a fan motor detecting an abnormality of a rotating number or a current, each product has a different setting for detecting the abnormality. In this case, the microchip controllers are individually programmed according to each product and the microchips are labeled in such a manner that the microchip controllers and the boards mounting thereon are correctly corresponding with each other after the program is written. Thereafter, the microchip controllers are mounted on the boards in a mass production.

Since the microchip controllers with an identical product name may have different written programs, the labeling and the management thereof are needed and are troublesome. The microchip controller is programmed so as to meet the specification of the set abnormality of the rotating number or the current in a mass production and then mounted on the board, so that productivity is not promised and a product reliability wherein the microchip controller and the board are correctly matched is also not satisfied.

SUMMARY OF THE INVENTION

It is an object of the present invention to provide a high reliable microchip controller board suitable for a mass production and a manufacturing method thereof so as to overcome the above problem.

To accomplish the object, according to a first aspect of the present invention, a microchip controller board comprises: a programmable microchip controller; terminals for writing a program into the microchip controller; and a circuit pattern having terminals for operating the microchip controller which are connected to shared terminals, and an operating circuit pattern for operating the microchip controller that is disconnected in a portion where the program writing is not obstructed.

In the microchip controller board according to a second aspect of the present invention, a gap of the disconnected portion of the operating circuit pattern is set to be narrower than widths of the operating circuit pattern and a programming circuit pattern, and an interval of the circuit pattern.

In the microchip controller board according to a third aspect of the present invention, the gap of the disconnected portion of the operating circuit pattern is 0.2 mm or less.

In the microchip controller board according to a fourth aspect of the present invention, the disconnected portion of the operating circuit pattern is formed into circularity.

According to a fifth aspect of the present invention, a manufacturing method for a microchip controller board including a programmable microchip controller, terminals for writing a program into the microchip controller, and a circuit pattern having terminals for operating the microchip controller which are connected to shared terminals, and an operating circuit pattern for operating the microchip controller that is disconnected in a portion where the program writing is not obstructed, comprises the steps of: mounting a non-programmed microchip controller on the board in a state where the operating circuit pattern for operating the microchip controller is disconnected; programming the microchip controller with a programming tool from the programming terminals of the microchip controller and then removing the programming tool; and connecting the disconnected portion where the operating circuit pattern for operating the microchip controller is disconnected, whereby the microchip controller board is manufactured.

According to a sixth aspect of the present invention, a manufacturing method for a microchip controller board including a program-rewritable microchip controller, terminals for writing a program into the microchip controller, and a circuit pattern having terminals for operating the microchip controller which are connected to shared terminals, and an operating circuit pattern for operating the microchip controller that is disconnected in a portion where a program writing is not obstructed, comprises the steps of: writing the program into the microchip controller and then connecting the portion where the circuit pattern is disconnected; disconnecting once again the cutting portion of the circuit pattern of the manufactured microchip controller board; changing the program of the microchip controller by the programming tool from the programming terminal of the microchip controller; removing thereafter said programming tool; connecting the portion where the operating circuit pattern for operating the microchip controller is disconnected, whereby the microchip controller board is manufactured.

DESCRIPTION OF THE PREFERRED EMBODIMENTS

Figure 1:
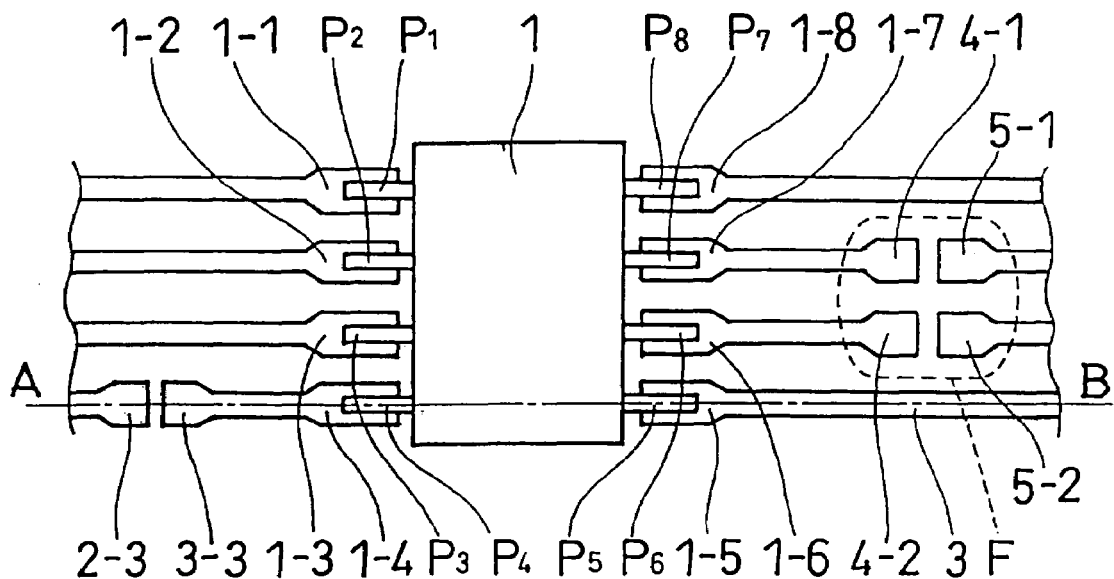
FIG. 1 is a diagram wherein a microchip controller of the present invention is provided on a board.
Figure 2:
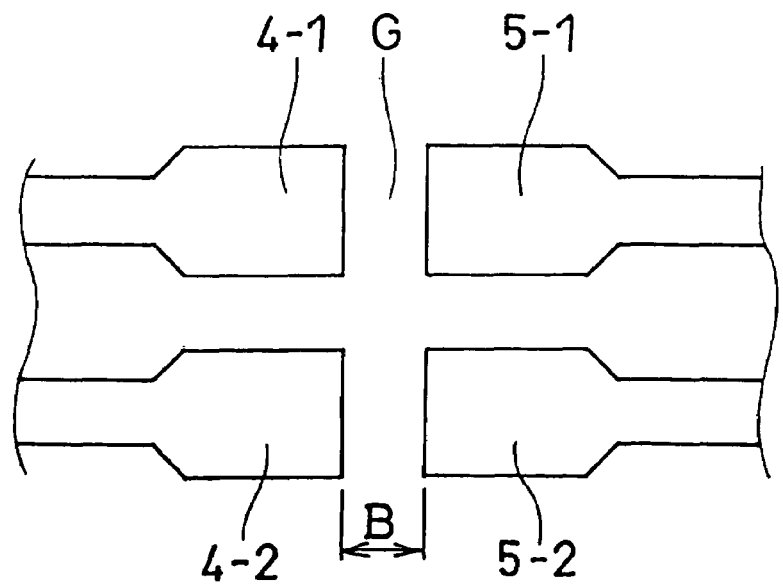
FIG. 2 is a magnification of a portion denoted as F surrounded by a broken line in FIG. 1.
Figure 3:
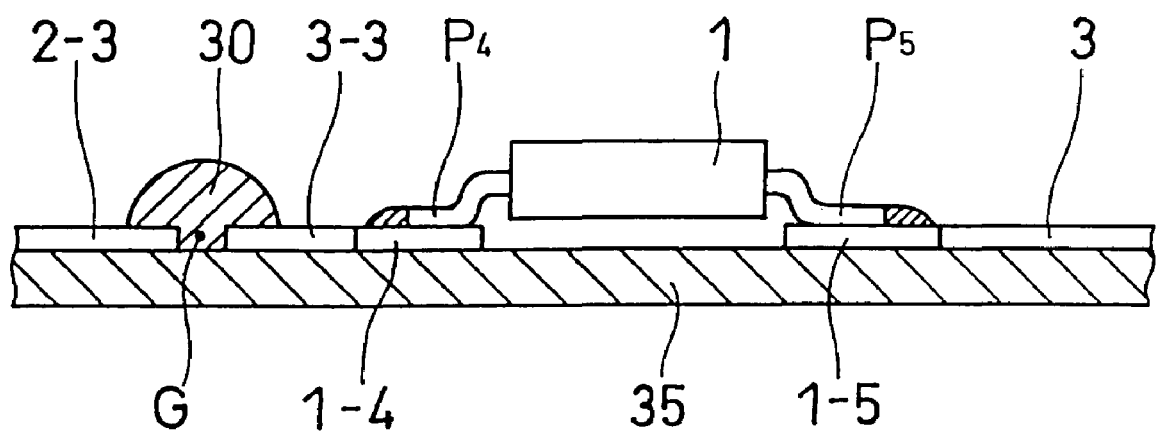
FIG. 3 is a cross-sectional view taken along the line A-B.

Next, an embodiment will be described with reference to the drawings. FIG. 1 is a diagram wherein a microchip controller 1 is mounted on a board, FIG. 2 is a magnification of a portion denoted as F surrounded by a broken line in FIG. 1, and FIG. 3 is a cross-sectional view taken along the line A-B in FIG. 1.

A printed wiring board is hereinafter described for better understanding of the present invention. The printed wiring board may be produced by forming a wiring pattern by copper foil on the outside of an insulative board such as a glass-cloth board epoxy-resin copper-clad laminate. The wiring pattern is provided with portions to which parts are mounted (hereinafter referred to as "land"), and terminals of the parts are mounted thereon while fusing the parts by soldering, or the like. Intervals between the lands are connected with a printed wiring thereby connecting the parts.

According to the present invention, a portion called as a pad is defined as below. That is, the printed wiring is disconnected in mid course of the wiring pattern. Both ends have a slight gap, and the gap having a width wider than that of the printed wiring which is capable of soldering or the like, e.g., a gold coating is called a pad. With reference to FIG. 2, reference numerals 4-1, 4-2, 5-1, and 5-2 denote the pads. And, the pad 4-1 and 4-2 as well as the pad 5-1 and 5-2 form a pair and have a gap G in a width B.

With reference to FIG. 1, the microchip controller 1 has terminals P4, P6 and P7 to be programmed. 1-1, 1-2, 1-3, 1-4, 1-5, 1-6, 1-7 and 1-8 are lands for mounting the microchip controller 1. P1, P2, P3, P4, P5, P6, P7 and P8 are terminals for an operating circuit which operate the microchip controller 1.

In FIG. 1, the microchip controller 1 is mounted on a printed wiring board 35 by being fused where the program is not written as shown in FIG. 3. The terminals P4, P6, and P7 sharing for operating circuit for operating the microchip controller 1 and for programming are mounted on the lands 1-4, 1-6, and 1-7 by being fused. And, a pattern formed with the lands 1-4, 1-6, and 1-7 is disconnected. In other words, the pads 2-3 and 3-3, the pads 4-1 and 5-1, and the pads 4-2 and 5-2 are provided in mid course of the pattern with gaps G facing each other, respectively.

After completing the programming of the microchip controller 1 as described later, the pads 2-3 and 3-3, the pads 4-1 and 5-1, and the pads 4-2 and 5-2 are covered with a conductor (e.g., solder) 30 as shown in FIG. 3 respectively and connected so as to operate the microchip controller 1.

A pattern 3 is conducted for a print-wiring on a printed wiring board 35 as shown in FIG. 3. The microchip controller 1 is fixed by being fused on the lands 1-4 and 1-5 with P4 and P5 respectively through soldering or the like. The land 1-4 is connected to the pad 3-3 while the pads 3-3 and 2-3 are provided with the gap G therebetween. As mentioned above, the gap G is covered with the conductor (such as solder) 30 as shown in FIG. 3 after completing the programming of the microchip controller 1 so as to connect the pads 2-3 and 3-3.

Figure 4:
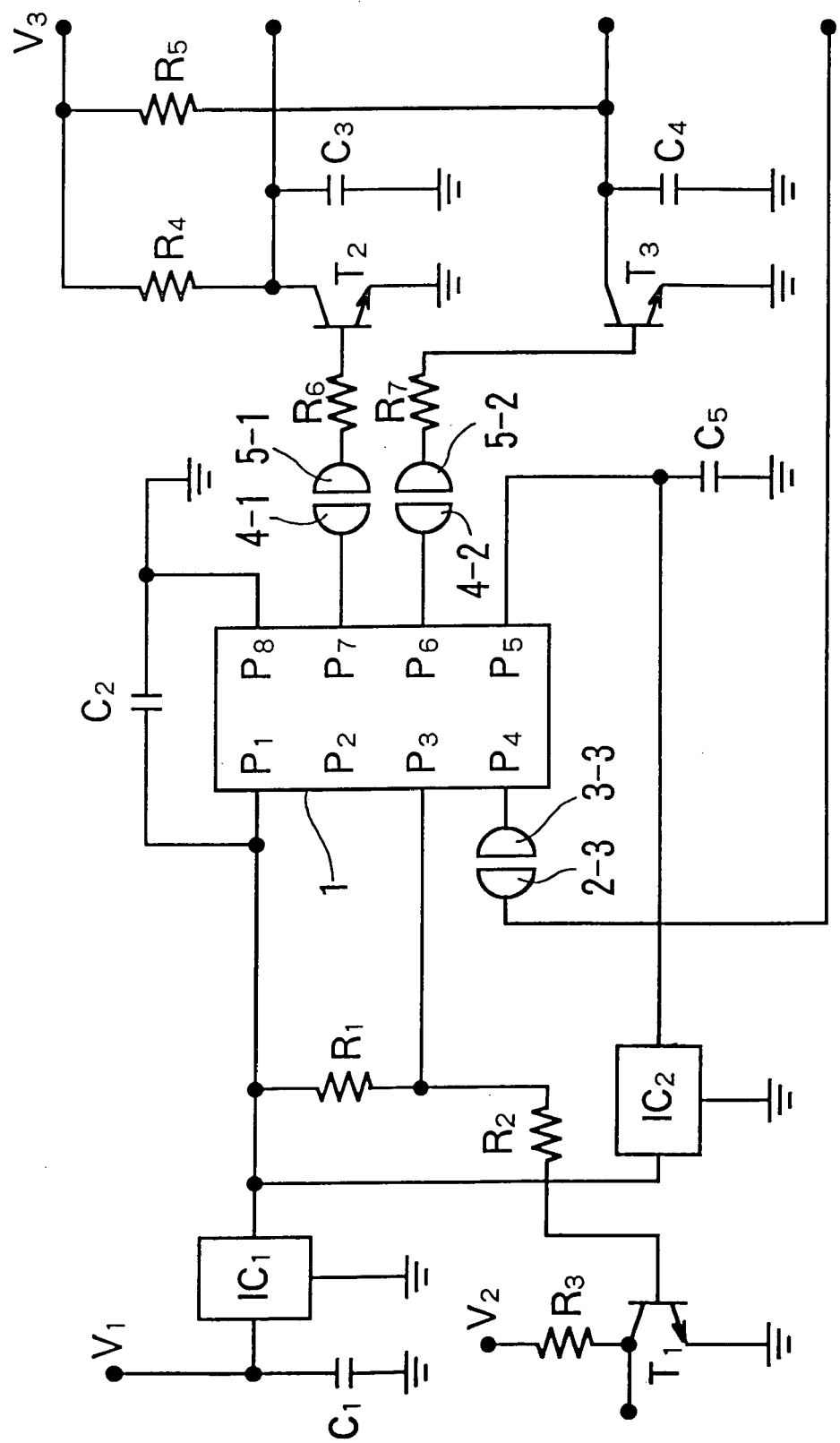
FIG. 4 is a diagram wherein the microchip controller is actually applied to a circuit.

FIG. 4 shows a diagram wherein the microchip controller 1 is actually applied to a circuit in relation to the pads. The operation shown in FIG. 4 is omitted due to having no direct relation to the present invention. With reference to FIG. 4, the microchip controller 1 is mounted on a board without being programmed. The patterns for the programming terminals P4, P6, and P7 are disconnected between the pads 2-3 and 3-3, the pads 4-2 and 5-2, and the pads 4-1 and 5-1, respectively. The other terminals P1, P3, P5, and P8 are connected to circuit parts, a power supply, and the ground, respectively.

In FIG. 4, when programming the microchip controller 1, the terminal P4, P6, and P7 function as a power supply terminal, a clock terminal and a data terminal, respectively. And, this programming is performed as follows. That is, the pads 2-3 and 3-3, the pads 4-1 and 5-1, and the pads 4-2 and 5-2 are disconnected, respectively thereby disconnecting the terminals P4, P6, and P7 from external circuits. The terminals P4, P6, and P7 of the microchip controller 1 is programmed by means of a programming tool such as a personal computer or the like in such a manner as to transmit predetermined signals to predetermined terminals.

Figure 5:
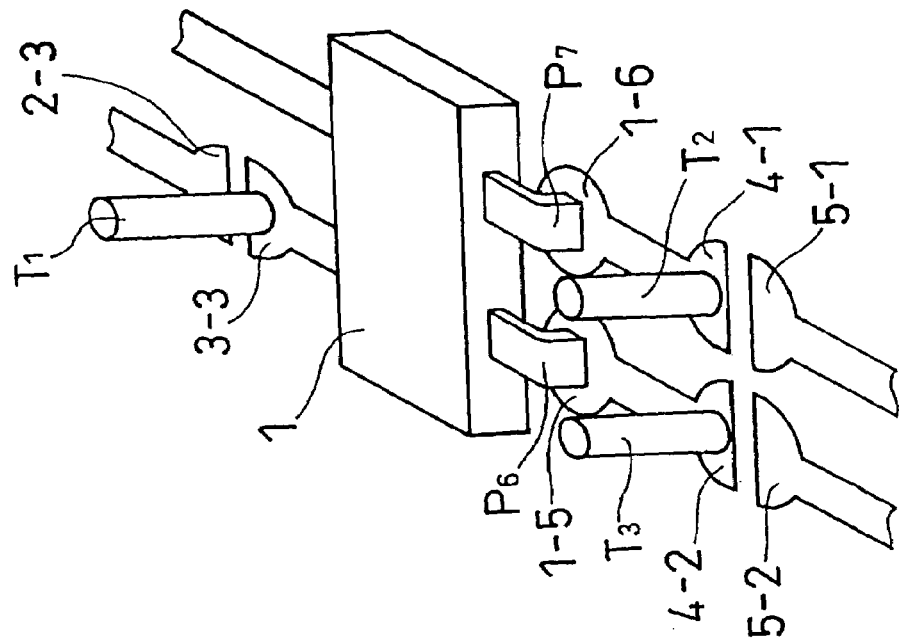
FIG. 5 is a diagram which illustrates an example of a method of applying a signal with a programming tool.

Alternatively, the signals may be transmitted with the programming tool whereby signal pins T1, T2, and T3 are provided on the pads 3-3, 4-1, and 4-2 on the side of the terminals of the microchip controller 1 over a printed wiring board as shown in FIG. 5 thereby transmitting the signals to the above signal pins. Further, a publicly-known IC clip may be pressed by the terminals of the microchip controller 1 so as to transmit the signals by the programming tool to the pins of the IC clip. Furthermore, a top end of the programming tool may directly come in contact with the terminals of the microchip controller 1 or with the lands or the pads connected to the terminals of the microchip controller 1 thereby transmitting the signals.

Following the normal programming, the pads 2-3 and 3-3, the pads 4-1 and 5-1, and the pads 4-2 and 5-2 are respectively covered with the conductor (such as solder) 30 as shown in FIG. 3 to be connected, and the operating circuit pattern for operating the microchip controller 1 is connected so as to complete the printed wiring board.

Figure 6:
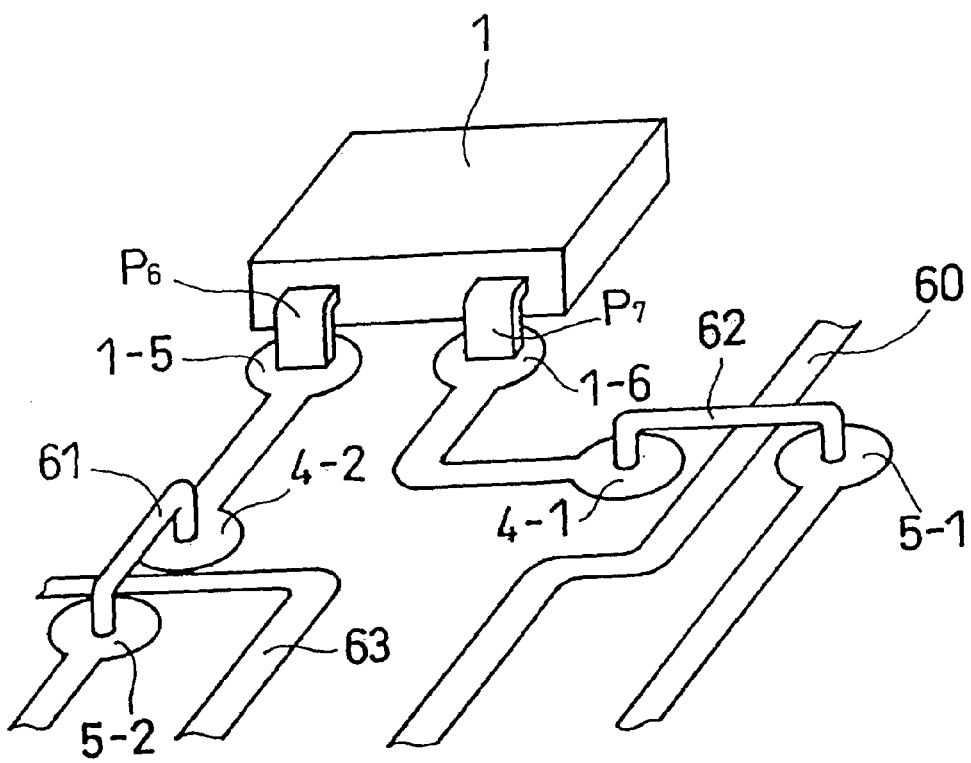
FIG. 6 is a diagram of an embodiment wherein the pads are not adjacently provided.

In case where the facing pads cannot be adjacently provided due to the design of the pattern, the corresponding pads may be connected by a jumper terminal or the like as shown in FIG. 6. If a wiring pattern 60 intersects a wiring comprising the pads 4-1 and 5-1 through the land 1-6 from the terminal P7 of the microchip controller 1, the pads 4-1 and 5-1 may be connected with a jumper terminal 62 in a state where both terminals are disconnected.

A similar method can be applied in case where a pattern 63 intersects wiring comprising the pads 4-2 and 5-2. In such a case, the pads 4-2 and 5-2 may be connected with a jumper terminal 61. It is well known for the jumper terminal or the like to be used in the printed wiring board, but the jumper terminal of the present invention, wherein the programming terminal of the microchip controller 1 is disconnected during programming, has never been applied. Accordingly, the pattern design can be more freely performed by applying the programming terminal of the above.

Figure 7:
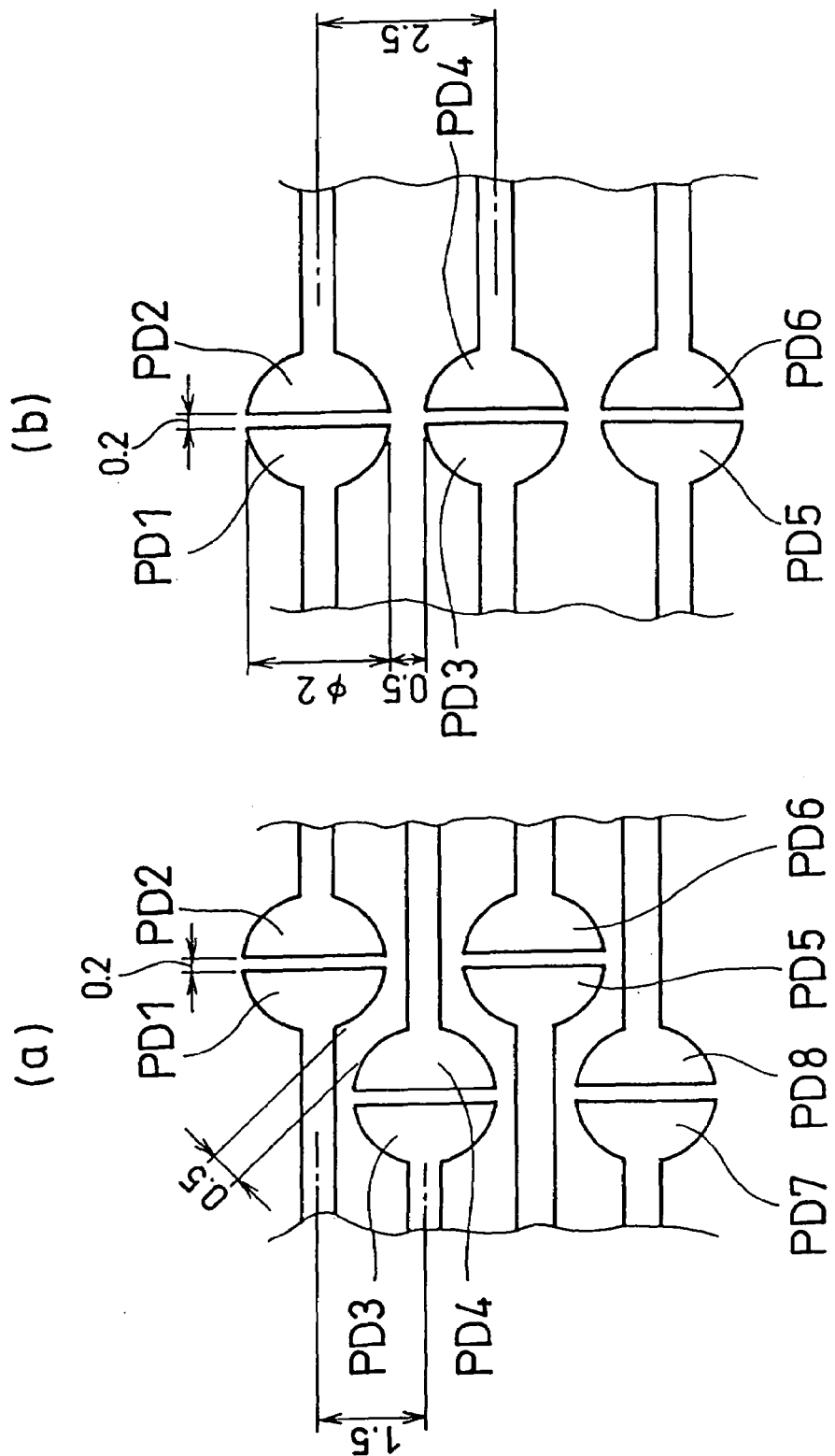
FIGS. 7A and 7B are diagrams of embodiments of the pads.

FIG. 7 shows two diagrams for specific embodiments of the pads. In FIG. 7, the shapes of the pads PD1, PD2, PD3, PD4, PD5, PD6, PD7 and PD8 are formed into circularity for the reason as follows. When the conductor (for example, solder) or the like is fused, the volume is forced to become a minimum by a surface tension forming a global shape. By circularly forming the pads, the conductors are smoothly and uniformly fused on the pads.

In case the gap G between the facing pads is wider than an allowable range, the conductor is separated into two due to the surface tension resulting in that the facing pads are not connected only with the conductor. On the contrary, If the gap G between the facing pads is narrower than an appropriate wideness, the gap G is blocked when printing a pattern, or the gap G is short-circuited by means of a metal growth of the conductor.

Consequently, the gap G between the pads is set to be narrower than a width of the operating circuit pattern for operating the microchip controller 1 and an interval of a circuit pattern.

FIG. 7A shows an embodiment wherein there is no allowance for a pattern design and an interval between the pattern wirings is narrow. Each pad should be deviated so as to conduct a pattern wiring with an interval narrower than the diameter of the pad. FIG. 7B shows another embodiment wherein there is a sufficient allowance for the pattern design and occupied areas for the pads are reduced in such a manner as to align each pad.

Specifically, the states of the surface tension of the conductor, a surface processing of the pads, etc. are comprehensively considered, and in FIG. 7A the size of the pad in diameter, the interval of the pattern wiring and the gap of the pads are set to be 2 mm, 1.5 mm and 0.2 mm, respectively while in FIG. 7B the size of the pad in diameter, the interval of the pattern wiring and the gap of the pads are set to be 2 mm, 2.5 mm and 0.2 mm, specifically.

And, it is quite natural for the printed wiring board to be subjected to processing of a resist film on the surface thereof by a well-known method.

According to the present invention, a microchip controller board comprises: a programmable microchip controller; terminals for writing a program into the microchip controller; and a circuit pattern having terminals for operating the microchip controller which are connected to shared terminals, and an operating circuit pattern for operating the microchip controller that is disconnected in a portion where a program writing is not obstructed. Accordingly, product reliability is improved because there is much less mistakes when mounting the microchip controller on the board based on the following reasons. There is no need for a pre-programming to meet a required specification different in each product and thereby no need for selecting a proper microchip controller to be mounted on a corresponding board because the microchip controller can be mounted without the pre-programming to meet the required specification of a certain product.

According to the present invention, a manufacturing method for a microchip controller board including a programmable microchip controller, terminals for writing a program into the microchip controller, and a circuit pattern having terminals for operating the microchip controller which are connected to shared terminals and an operating circuit pattern for operating the microchip controller that is disconnected in a portion where the program writing is not obstructed comprises the steps of: mounting the non-programmed microchip controller on the board where the operating circuit pattern for operating the microchip controller is disconnected; programming the microchip controller with a programming tool from the programming terminals of the microchip controller; removing thereafter the programming tool; and connecting the portion at which the operating circuit pattern for operating the microchip controller is disconnected so as to manufacture the microchip controller board. According to this manufacturing method, various kinds of the microchip controller board can be mass produced.

What is claimed is:

1. A manufacturing method for a microchip controller board including a programmable microchip controller, terminals for writing a program into said microchip controller, and a circuit pattern having terminals for operating said microchip controller which are connected to shared terminals, and an operating circuit pattern for operating said microchip controller that is disconnected in a portion where a program writing is not obstructed, comprising the steps of:
   mounting said non-programmed microchip controller on said board in a state in which said operating circuit pattern for operating said microchip controller is disconnected;
   programming said microchip controller with a programming tool from the programming terminals of said microchip controller;
   removing thereafter said programming tool; and
   connecting the portion where said operating circuit pattern for operating said microchip controller is disconnected, thereby manufacturing said microchip controller board.

2. A manufacturing method for a microchip controller board including a program-rewritable microchip controller, terminals for writing a program into said microchip controller, and a circuit pattern having terminals for operating said microchip controller which are connected to shared terminals, and an operating circuit pattern for operating said microchip controller that is disconnected in a portion where the program writing is not obstructed, comprising the steps of:
   writing a program into said microchip controller;
   connecting thereafter the portion where said operating circuit pattern is disconnected;
   disconnecting once again said connected portion of said circuit pattern of the microchip controller board;
   changing the program of said microchip controller by a programming tool from the programming terminal of said microchip controller;
   removing thereafter said programming tool;
   connecting the portion where said operating circuit pattern for operating said microchip controller is disconnected, thereby manufacturing said microchip controller board.

* * * * *